United States Patent
Hilgers et al.

(10) Patent No.: US 11,563,163 B2
(45) Date of Patent: Jan. 24, 2023

(54) ACTUATOR DEVICE INCORPORATING AN ELECTROACTIVE POLYMER ACTUATOR AND A DRIVING METHOD

(71) Applicant: KONINKLIJKE PHILIPS N.V., Eindhoven (NL)

(72) Inventors: Achim Hilgers, Alsdorf (DE); Mark Thomas Johnson, Arendonk (BE); Daan Anton Van Den Ende, Breda (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 586 days.

(21) Appl. No.: 16/485,815

(22) PCT Filed: Feb. 12, 2018

(86) PCT No.: PCT/EP2018/053381
§ 371 (c)(1),
(2) Date: Aug. 14, 2019

(87) PCT Pub. No.: WO2018/153708
PCT Pub. Date: Aug. 30, 2018

(65) Prior Publication Data
US 2020/0052185 A1    Feb. 13, 2020

(30) Foreign Application Priority Data
Feb. 23, 2017   (EP) .................................... 17157520

(51) Int. Cl.
*H01L 41/04*     (2006.01)
*H01L 41/09*     (2006.01)
*H01L 41/193*    (2006.01)

(52) U.S. Cl.
CPC ............. *H01L 41/042* (2013.01); *H01L 41/09* (2013.01); *H01L 41/193* (2013.01)

(58) Field of Classification Search
CPC ...... H01L 41/042; H01L 41/09; H01L 41/193
(Continued)

(56) References Cited

U.S. PATENT DOCUMENTS 7,315,109 B1   1/2008   Griffiths et al.
9,170,650 B2   10/2015  Ramstein et al.
(Continued)

FOREIGN PATENT DOCUMENTS

DE   202005004368 U1   6/2005
GB     2475224 A        5/2011
(Continued)

OTHER PUBLICATIONS

Spinks et al "Enhanced Control and Stability of Polypyrrole Electromechanical Actuators" Synthetic Metals, 140 (2004) p. 273-280.
(Continued)

*Primary Examiner* — Derek J Rosenau
(74) *Attorney, Agent, or Firm* — Schott, P.C.

(57) ABSTRACT

A field-driven electroactive polymer actuator is provided with a current sensor for sensing a current flowing to the actuator. A control circuit is used for driving the actuator which includes a voltage source. The driving of the actuator is controlled in dependence on the sensed current, thereby to provide a predetermined charge delivery for particular changes in actuation level of the actuator. This provides a combined voltage-based and current-based drive scheme for a voltage-driven EAP actuator, and it enables mechanical movements of the actuator to be more reliably repeated.

20 Claims, 6 Drawing Sheets

(58) Field of Classification Search
USPC .......................................................... 310/317
See application file for complete search history.

(56) References Cited

U.S. PATENT DOCUMENTS

| | | | |
|---|---|---|---|
| 9,368,709 B2 | 6/2016 | Brokken et al. | |
| 9,618,739 B2 | 4/2017 | Brokken et al. | |
| 2002/0175594 A1 | 11/2002 | Kornbluh et al. | |
| 2008/0056920 A1* | 3/2008 | Griffiths | H01L 41/042 417/505 |
| 2011/0133676 A1 | 6/2011 | Ikushima et al. | |
| 2012/0046765 A1* | 2/2012 | Nikolic | B06B 1/0253 700/90 |
| 2014/0306624 A1 | 10/2014 | Namuduri et al. | |
| 2017/0003825 A1 | 1/2017 | Kwak et al. | |
| 2017/0279031 A1 | 9/2017 | Yoo et al. | |
| 2018/0175746 A1 | 6/2018 | Van Den Ende et al. | |

FOREIGN PATENT DOCUMENTS

| | | |
|---|---|---|
| JP | 2012-518384 A | 8/2012 |
| JP | 2015-154076 A | 8/2015 |
| RU | 2568944 C2 | 11/2015 |
| RU | 2589245 C2 | 7/2016 |
| WO | 2016193432 A1 | 12/2016 |

OTHER PUBLICATIONS

International Search Report From PCT/EP2018/053381 dated Apr. 24, 2018.

* cited by examiner

ACTUATOR DEVICE INCORPORATING AN ELECTROACTIVE POLYMER ACTUATOR AND A DRIVING METHOD

CROSS-REFERENCE TO PRIOR APPLICATIONS

This application is the U.S. National Phase application under 35 U.S.C. § 371 of International Application No. PCT/EP2018/053381, filed on Feb. 12, 2018, which claims the benefit of EP Patent Application No. EP 17157520.2, filed on Feb. 23, 2017. These applications are hereby incorporated by reference herein.

FIELD OF THE INVENTION

This invention relates to electroactive polymer actuators.

BACKGROUND OF THE INVENTION

Electroactive polymers (EAPs) are an emerging class of materials within the field of electrically responsive materials. EAPs can work as sensors or actuators and can easily be manufactured into various shapes allowing easy integration into a large variety of systems.

Materials have been developed with characteristics such as actuation stress and strain which have improved significantly over the last ten years. Technology risks have been reduced to acceptable levels for product development so that EAPs are commercially and technically becoming of increasing interest. Advantages of EAPs include low power, small form factor, flexibility, noiseless operation, accuracy, the possibility of high resolution, fast response times, and cyclic actuation.

The improved performance and particular advantages of EAP materials give rise to applicability to new applications.

An EAP device can be used in any application in which a small amount of movement of a component or feature is desired, based on electric actuation. Similarly, the technology can be used for sensing small movements. This invention relates in particular to actuators.

The use of EAPs in actuator devices enables functions which were not possible before, or offers a big advantage over common actuator solutions, due to the combination of a relatively large deformation and force in a small volume or thin form factor, compared to common actuators. EAPs actuators also give noiseless operation, accurate electronic control, fast response, and a large range of possible actuation frequencies, such as 0-1 MHz, most typically below 20 kHz.

Devices using electroactive polymers can be subdivided into field-driven and ionic-driven materials.

Examples of field-driven EAPs include Piezoelectric polymers, Electrostrictive polymers (such as PVDF based relaxor polymers) and Dielectric Elastomers. Other examples include Electrostrictive Graft polymers, Electrostrictive paper, Electrets, Electroviscoelastic Elastomers and Liquid Crystal Elastomers.

Examples of ionic-driven EAPs are conjugated/conducting polymers, Ionic Polymer Metal Composites (IPMC) and carbon nanotubes (CNTs). Other examples include ionic polymer gels.

This invention relates in particular to actuator devices which incorporate a field-driven EAP material. These devices are actuated by an electric field through direct electromechanical coupling. They require high fields (volts per meter) but low currents due to their capacitive nature. Polymer layers are usually thin to keep the driving voltage as low as possible.

A first notable subclass of field driven EAPs are Piezoelectric and Electrostrictive polymers. While the electromechanical performance of traditional piezoelectric polymers is limited, a breakthrough in improving this performance has led to PVDF relaxor polymers, which show spontaneous electric polarization (field driven alignment). These materials can be pre-strained for improved performance in the strained direction (pre-strain leads to better molecular alignment). Normally, metal electrodes are used since strains usually are in the moderate regime (1-5%). Other types of electrodes (such as conducting polymers, carbon black based oils, gels or elastomers, etc.) can also be used. The electrodes can be continuous, or segmented.

Another subclass of interest of field-driven EAPs is that of Dielectric Elastomers. A thin film of this material may be sandwiched between compliant electrodes, forming a parallel plate capacitor. In the case of dielectric elastomers, the Maxwell stress induced by the applied electric field results in a stress on the film, causing it to contract in thickness and expand in area. Strain performance is typically enlarged by pre-straining the elastomer (requiring a frame to hold the pre-strain). Strains can be considerable (10-300%). This also constrains the type of electrodes that can be used: for low and moderate strains, metal electrodes and conducting polymer electrodes can be considered, for the high-strain regime, carbon black based oils, gels or elastomers are typically used. The electrodes can be continuous, or segmented.

Figure 1:
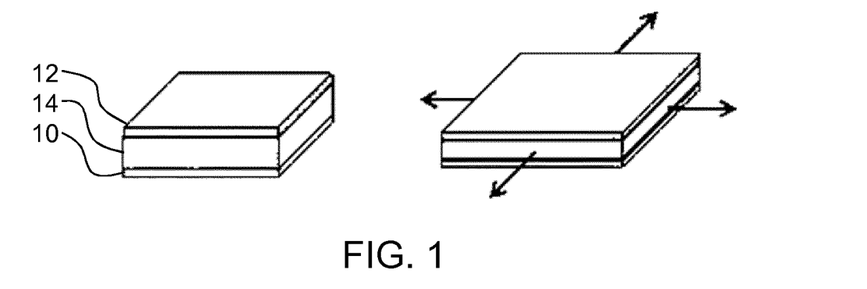
FIG. 1 shows a known electroactive polymer device which is not clamped.
Figure 2:
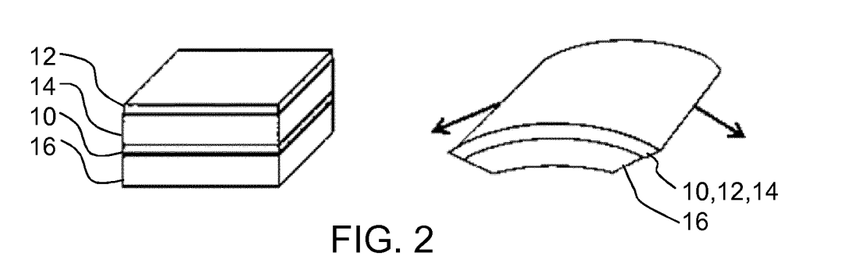
FIG. 2 shows a known electroactive polymer device which is constrained by a backing layer.

FIGS. 1 and 2 show two possible operating modes for an EAP device.

The device comprises an electroactive polymer layer 14 sandwiched between electrodes 10, 12 on opposite sides of the electroactive polymer layer 14.

FIG. 1 shows a device which is not clamped. A voltage is used to cause the electroactive polymer layer to expand in all directions as shown.

FIG. 2 shows a device which is designed so that the expansion arises only in one direction. The device is supported by a carrier layer 16. A voltage is used to cause the electroactive polymer layer to curve or bow.

The nature of this movement for example arises from the interaction between the active layer which expands when actuated, and the passive carrier layer. To obtain the asymmetric curving around an axis as shown, molecular orientation (film stretching) may for example be applied, forcing the movement in one direction.

The expansion in one direction may result from the asymmetry in the EAP polymer, or it may result from asymmetry in the properties of the carrier layer, or a combination of both.

One problem with field driven electroactive polymers is the rather high operation voltages that are required, as mentioned above, to achieve high electric field strengths in the devices to realize desired deflections. Electronic driving circuits are used to generate these high voltages and to perform other signal processing. Driving voltage amplitudes of up to 1 kV are required for these EAPs, so that high voltage devices need to be used and implemented, increasing the cost (and size) of the electronics enormously.

Due to their nature, typically field-driven (i.e. voltage driven) EAPs are operated by a (constant) voltage source. The EAP is provided with a desired voltage to reach a required operation point, namely a desired mechanical deflection. However, during experimental investigations of such EAPs it has been recognized that although an identical voltage has been applied to an EAP, the mechanical actuation level is different, especially in a cyclic operation mode. This of course would result in unacceptable offsets in particular applications where very precise actuation levels need to be reached in a very reliable way.

In order to compensate these offsets in actuation level, closed loop architectures or feedforward configurations may be considered. The first approach requires feedback solutions such as optical feedback, and the second approach may for example be based on look-up tables which define the compensation regime. Both solutions require enormous overhead either in terms of costs and/or space and/or processing power, etc.

It would be desirable to enable operation of voltage-driven EAPs which allows for a real-time compensation of deflection offsets, at reduced overhead.

SUMMARY OF THE INVENTION

The above need is at least partly fulfilled with the invention as defined by the independent claims. The dependent claims provide advantageous embodiments.

Examples in accordance with an aspect of the invention provide an actuator device for converting an electrical input into a mechanical output comprising:

a field-driven electroactive polymer actuator;

a current sensor for sensing a current flowing to the electroactive polymer actuator; and a control circuit for driving the electroactive polymer actuator, wherein the control circuit comprises a controllable voltage source, wherein the control circuit is adapted to control the driving of the actuator in dependence on the sensed current, thereby to provide a predetermined charge delivery to the actuator based on current monitoring to implement particular changes in actuation level of the actuator and then to maintain an actuation level using voltage control.

This device includes a field-driven and hence voltage-driven EAP actuator device, but it is controlled using current control based on real-time monitoring of the current provided to (and hence charge stored in) the actuator device. Thus, instead of operating voltage-driven EAP actuators with only a voltage source, the device is operated either with a current source (and for example a constant voltage during the period of current control) or with voltage control but based on a current sensing feedback control loop. This allows for real-time compensation of mechanical actuation offsets, especially in cyclic operation modes.

The current sensing (which may be based on measuring current or charge flow) takes place in particular during actuation times when there is a change in actuation level. During this time there is a change in the charge provided to and stored on the device. During steady state operation, there is a small leakage current, but it has been found that differences in charge delivered during actuation times are correlated with the eventual mechanical actuation state reached by the actuator. The current can thus be controlled in such a way that for each actuation level the EAP is always provided with the correct current profile or total charge to result in the desired mechanical actuation.

The particular changes for example comprise actuation to specific actuation levels. For example, actuation to a full mechanical deformation state may be associated with a particular required charge flow to the actuator.

The voltage source is for example controllable to deliver a maximum voltage of at least 50V or at least 100V or at least 200V. Thus, the actuator is a high voltage field-driven device, and hence voltage-driven device, which is conventionally controlled based only on the applied voltage.

The control circuit is adapted to provide a predetermined charge delivery to the actuator based on current monitoring to implement a change in actuation level, and then to maintain an actuation level using voltage control. Thus, the steady state operation is maintained in conventional manner using voltage control, as is desirable for a field-driven device because it enables better compensation/tolerance for losses. However, changes in actuation level additionally make use of a current based feedback control approach.

The predetermined charge delivery may be provided with an actuation voltage which exceeds the voltage level during the voltage control.

In one set of examples, the predetermined charge delivery is provided by a current source of the control circuit. Thus, current injection may be used to ensure the delivery of the required charge to accompany actuation to a particular level. The current source for example includes the voltage source. The voltage source delivers an amplitude high enough to impress the required current into the device, but low enough not to destroy the component, and the current is then controlled with a current measuring mechanism for feedback control.

The control circuit then includes a current source as well as having a controllable voltage. This provides a hybrid current-based and voltage-based control approach.

In another set of examples, the predetermined charge delivery is provided by adjusting a voltage level of the voltage source of the control circuit. In this case, there is a current control feedback loop, but the voltage applied is controlled to effect the desired current injection.

A current limiting circuit may be provided to limit a charging current provided to the actuator. This avoids current peaks, which would render the charge monitoring less accurate. It can also improve the lifetime of the EAP material.

The controller may be further adapted to monitor a resistance value of the actuator and adapt the predetermined current delivery in response to the monitored resistance value. This resistance value may be a parasitic parallel resistance, which relates to a constant leakage current in a steady state condition of the actuator device. By monitoring this current at a known drive voltage, the resistance can be determined, and this can be used to adapt the drive scheme to take account of ageing of the device.

Examples in accordance with another aspect of the invention provide a method of driving a field-driven electroactive polymer actuator, comprising:

applying a voltage to the actuator to change an actuation state of the actuator;

sensing a current flowing to the actuator; and controlling the actuation of the actuator in dependence on the sensed current, thereby to provide a predetermined charge delivery for a particular change in actuation level of the actuator and then maintaining an actuation level using voltage control.

The method may comprise applying a maximum voltage of at least 50V or at least 100V or at least 200V.

The predetermined charge delivery may be providing using a current source or by adjusting a voltage level of a voltage source. The method may further comprise limiting a charging current provided to the actuator. Furthermore, the method may comprise monitoring a resistance value of the actuator and adapting the predetermined current delivery in response to the monitored resistance value.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a field-driven electroactive polymer actuator which is provided with a current sensor for sensing a current flowing to the actuator. A control circuit is used for driving the actuator which includes a voltage source. The driving of the actuator is controlled in dependence on the sensed current, thereby to provide a predetermined current delivery for particular changes in actuation level of the actuator. This provides a combined voltage-based and current-based drive scheme for a voltage-driven EAP actuator, and it enables mechanical movements of the actuator to be more reliably repeated.

In general terms, field driven electroactive polymer (EAP) actuators consist of an electrically isolating material, embedded between two electrically conducting electrodes. As a function of an applied voltage, the electric field between the electrodes causes a mechanical deformation of the EAP. As explained above, by using additional materials with a different extension coefficient (e.g. stiffness) to the EAP layer, the mechanical deformation can be directed in certain directions. By implementing multilayer technology, the field strength between the electrodes can be increased and hence lower voltage amplitudes are required to operate the EAP actuator, or higher mechanical deformations can be realized.

This invention relates to the problem that a given voltage actuation profile may give rise to different mechanical actuation levels, thus giving rise to a mechanical offset.

Figure 3:
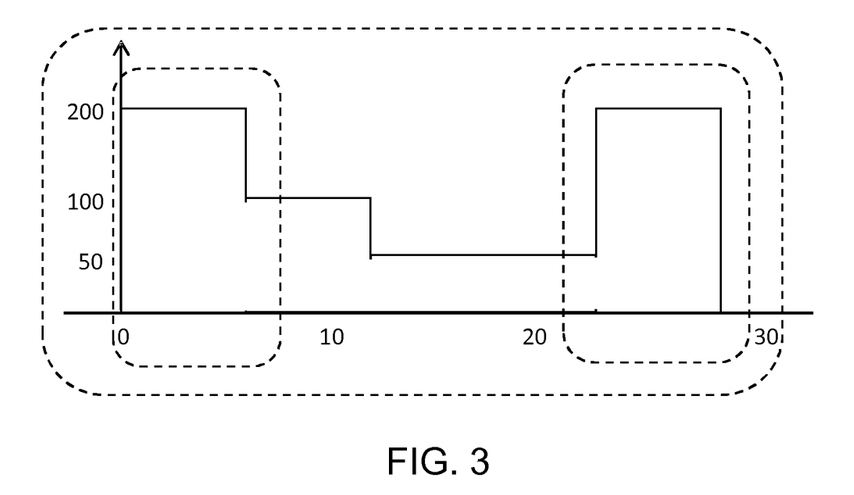
FIG. 3 shows an example of a cyclic actuation waveform used to illustrate the mechanical drift which can arise.

The mechanical offset will now be described by means of a set of measurements which have been made using a standard voltage-driven EAP actuator. A sample was actuated according to an arbitrary cyclic scheme, where different actuation levels were addressed as shown in FIG. 3.

Starting from a non-activated state (equal to no actuation voltage applied to the EAP actuator) the actuator was actuated by a voltage of 200V, followed by a reduced actuation voltage of 100V and 50V respectively as well a second maximum voltage of 200V. Finally, the EAP actuator was deactivated by reducing the applied voltage down to zero.

Although the particular cycle was arbitrarily chosen, it represents a typical actuation cycle in an application, where during a certain time frame different actuation levels between a minimum (deactivated) level and a local maximum level need to be employed. During the experiment, the cycle was applied to the EAP actuator continuously (14 times).

Figure 4:
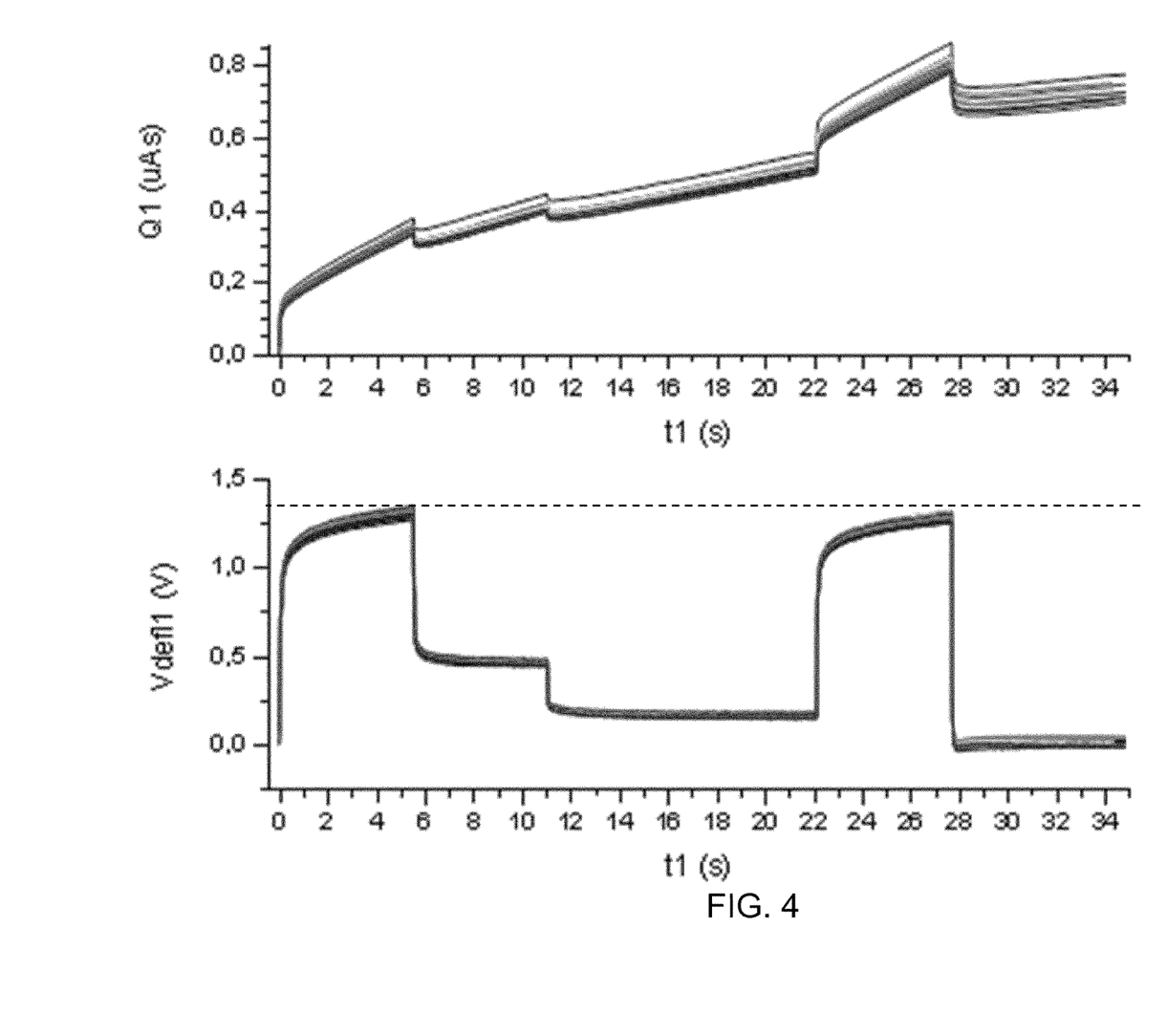
FIG. 4 shows the results of testing an actuator using the waveform of FIG. 3.

FIG. 4 shows the full test results. The applied voltage is shown in FIG. 3 (and the timing relative to the two plots of FIG. 4 can be clearly seen from the bottom plot of FIG. 4). The top plot shows the integrated charge impressed into the device and the bottom plot shows the mechanical actuation level (as a voltage recorded by a deflection measurement probe).

For ease of representation, one cycle is shown, starting at t=0. Although a continuous operation was provided, each cycle is represented as starting at t=0 and Q=0 so that each plot shows the overlay of 14 different traces, each trace comprising one of the cycles. This allows for a good comparison of any differences in the actuation level.

The divergence between the different plots shows how the actuator response does not remain consistent over time.

Of particular interest is the mechanical actuation level reached when applying the maximum voltage of 200V to the EAP actuator. Within one cycle this is the case during the initial pulse and the end pulse.

The bottom plot shows a typical small variation in the zero (normal) position, when no voltage is applied to the EAP actuator, in that the zero level is a thick line—indicating that the 14 traces have slightly different zero values. There are also small actuation variations at different actuation levels.

However, FIG. 4 also shows that the second maximum actuation pulse amplitude within each cycle (200V, for each cycle) results in a slightly lower deflection amplitude than the first pulse within each individual cycle. This can be seen from the dashed line which makes clear the general reduction in mechanical drive level between the first and second pulses. The offset is about 0.05 V (which for a deflection sensitivity of 0.8 mm/V corresponds to 40 µm). This is the case even though the same driving voltage of 200V is applied to the EAP actuator.

It can be seen that the problem arises in particular when there are rapid changes in actuation level, since the first maximum pulse of the next cycle is shown to recover back to the desired level.

A clear correlation with this effect can be observed by analyzing the top plot, showing the charge impressed into the EAP actuator.

Figure 5:
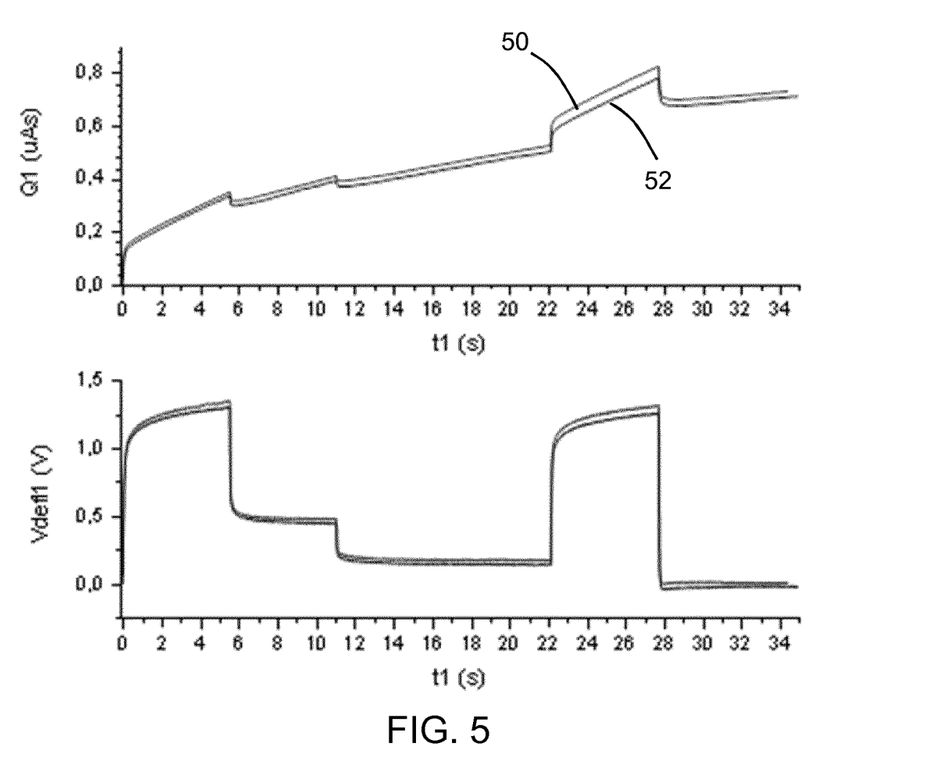
FIG. 5 shows the charge delivered to the EAP during two maximum amplitude time periods within one cycle.

The top part of FIG. 5 shows the charge delivered to the EAP actuator during two successive cycles. Plot 50 is the charge delivered during the first cycle and plot 52 is the charge delivered during the second cycle. The difference in charge delivered is most prominent during the second high-amplitude pulse. This causes the mechanical actuation level to change over time, most notably during the second high-amplitude pulse of the cycle, as can be seen from the bottom part of FIG. 5.

In order to compensate for this effect, the driving-amplitude of the second maximum actuation pulse within one cycle may be slightly increased to make it higher in voltage than the first pulse. However, it is clear how much higher the voltage amplitude needs to be.

The offset in driving amplitude may be generated from a real time measurement of the deflection (and a corresponding control loop) or based on a look-up table. While the first solution requires a significant measurement and control overhead, the second solution requires the detailed characterization of the component prior to the application in order to generate such a look-up table.

This invention is based on combining a current sensing feedback approach (for example a current source drive method) with a high voltage actuation method to provide a more uniform deflection response of the actuator.

For example, the voltage-driven EAP actuator may be actuated (at least in part) by a current source instead of a voltage source. In this case the current (i.e. charge flow) during each actuation cycle or portion of an actuation cycle can be measured, and the control is adapted to ensure that each pulse (i.e. an actuation cycle or portion of an actuation cycle) has the same profile or same total charge injection into the EAP actuator. The current can easily be measured by known solutions such as by measuring the voltage drop across a small current sense resistor in series with the EAP actuator.

This charge flow control takes place during the parts of an actuation profile where there are changes in actuation level. Between these parts of the actuation profile, there may be time periods during which the preceding final actuation level is maintained. During these times, voltage control is used to maintain the actuation state. Thus, the actuation profile has first periods (the profiled portion of the actuation cycle during which actuation level changes are made) and second periods between the first periods. The second periods for example have a longer duration than the first periods so that there is a cyclic control signal of alternating adjustment phases and hold phases.

Figure 6:
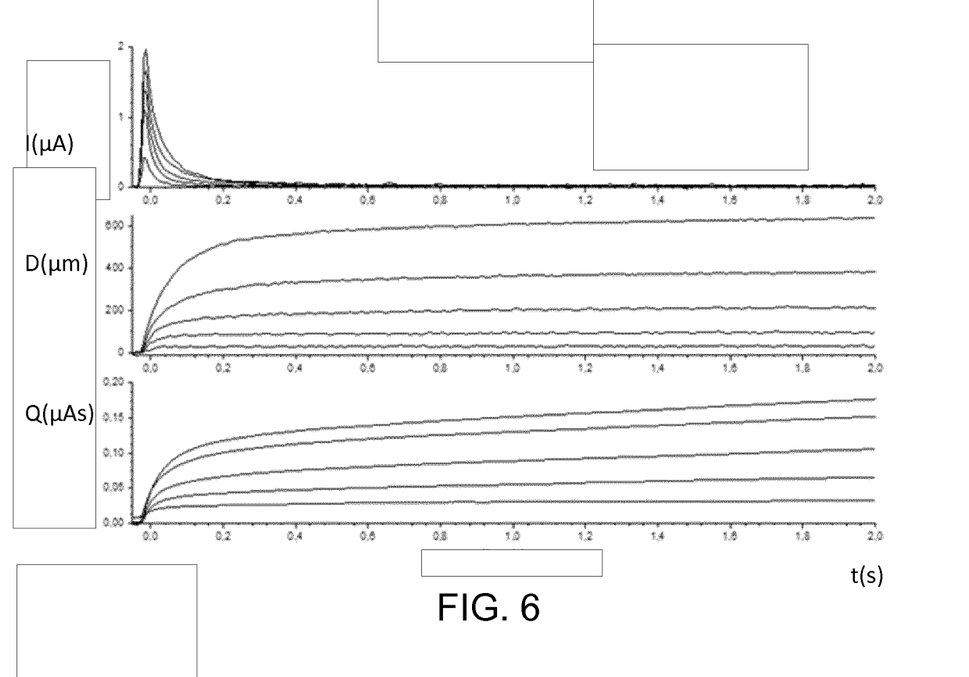
FIG. 6 shows the response of the EAP to actuation in terms of the charge, current and deflection.

FIG. 6 shows the response of the EAP to actuation in terms of the charge, current and deflection in response to DC activation voltages applied at time t=0. The actuation voltages are 40V, 80V, 120V, 160V and 200V. The top pane shows the current flowing to the EAP, the middle pane shows the deflection and the bottom pane shows the charge accumulated. In all graphs, the highest plot (i.e. largest current, deflection and charge) is for the highest actuation voltage (i.e. 200V) and the lowest plot is for the lowest actuation voltage (i.e. 40V).

FIG. 6 shows that for this actuator design, after about 300 ms the slope of the charge becomes constant and linear and then tracks the slope of the mechanical deformation. Very little additional current is drawn after this time. The total deformation amplitude was found to be 800 μm (for Vdc=200V) read out after 45 seconds.

At the 300 ms time point, the deflection has already reached 600 μm for the 200V actuation. Thus, it can be seen that the charge control may be used for a relative short period and voltage control can then take over.

One possible control scheme is that once the slope of the charge plot (which is of course the current) becomes constant or becomes zero, the system can switch to a voltage driven mode of operation. A threshold may be set for the current, and whenever the current drops below a certain threshold, voltage control can be adopted. The threshold may for example be 10% (for this specific example) of the maximum current amplitude.

The switchover to voltage based control once the desired change in deflection has been controlled is desirable because voltage control is able to tolerated losses. such as losses caused by parallel loss mechanisms resulting from a non-perfect isolation of the material. These losses are temperature-dependent and unpredictable and hence difficult to compensate using current control. These losses are instead automatically compensated by voltage control, because any variation in current (due to the variable losses) will be covered by the constant voltage source. Thus, voltage control is desired for general operation of field-driven EAP devices, and the current control is used only as a temporary measure to improve the accuracy with which the deflection may be controlled.

Figure 7:
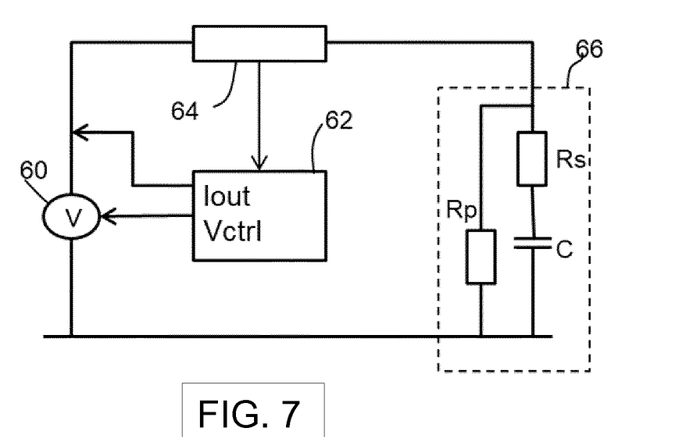
FIG. 7 shows a control circuit for providing voltage and current control.

FIG. 7 shows the control circuit. There is a controllable voltage source 60, and controller 62 for providing the control voltage Vctrl to the voltage source. It may also provide an injection current Iout as will be explained below. In all examples, there is a current control loop in addition to voltage driving of the actuator.

The controller 62 receives a current measurement, from a current sensor such as a current sense resistor 64 in series with the EAP actuator. The voltage driven EAP actuator is shown as its equivalent circuit 66, of a capacitance C with a series resistance Rs and a parallel resistance Rp across the resistor-capacitor pair Rs,C. The controller is able to monitor the shape of the current profile by monitoring the current over time. This can also be used to monitor the charge stored on the actuator over time.

The equivalent circuit 66 is a first approximation of a voltage driven EAP actuator. The parallel resistor Rp is a large lossy resistor compared to the series resistor. A small current will flow through the parallel resistor Rp so that the current flow which actually contributes to the mechanical actuation will be slightly lower than the total measured current. In order to make the charge control even more precise, the charging process may be separated from the steady state operation mode (where a small current is only flowing through the parallel resistor). The small current can then be determined and hence the dynamic current profile may be more accurately determined.

This can be achieved by investigating the slope of the current through the EAP actuator.

In FIG. 4 and FIG. 5 it can clearly be seen that during the first portion (around 200 ms) of the charge waveform, the slope is different than thereafter, where it essentially has a linear (constant) slope. Therefore, the slope of the change profile, based on a derivative or higher derivative analysis, can be used in order to separate between a charging stage and a (quasi) steady state operation mode. The differences in the waveform shape arise during the charging stage, and hence compensation is required for this charging stage.

Typically, the parallel resistance is in the range of about 10 MΩ so that at 200V a current of 200V/10 MΩ=20 μA is flowing through this parallel resistor.

Figure 8:
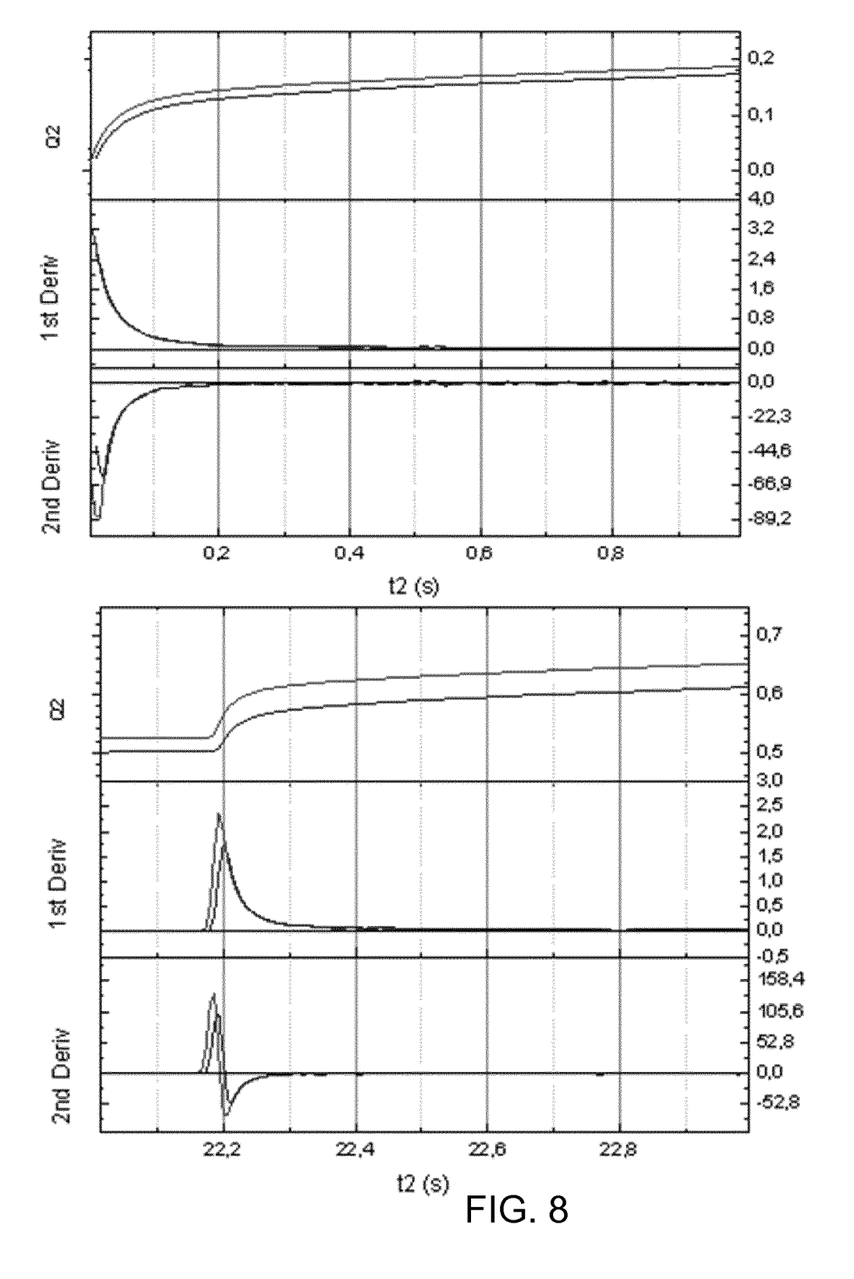
FIG. 8 shows derivative waveforms to illustrate how the important charging stage of the actuation can be analyzed.

FIG. 8 shows derivative waveforms to illustrate how the important charging stage of the actuation can be analyzed.

The top pane shows the charging characteristics for the first high pulse of the drive waveform (of FIG. 3) and the bottom pane shows the charging characteristics for the second high pulse of the drive waveform.

In both panes, the top plot shows the integrated current (i.e. charge) flowing to the EAP actuator during the first part second of the respective 200V pulse (the top pane shows 1 s of the first pulse and the bottom pane shows 0.8 s of the second pulse as well as the preceding 0.2 s).

A variation in charge can be observed during the transition from a lower actuation state to a higher one. A higher charge corresponds to a higher deflection.

The middle plot shows the first derivative, i.e. the current level. The bottom plot shows the second derivative, i.e. the derivative of the current.

The charging stage can thus be identified as the period before the second derivative reaches zero (i.e. there is then a constant current), and the feedback control may then be based on creating an additional charge flow to compensate for the change in charge (i.e. the difference between the two plots in the top image of each pane) at that time. Once the additional compensating charge is provided, the actuator will continue with the correct steady state response.

The invention makes use of a voltage source to drive the actuator (as is conventional) but a control circuit is adapted to implement control in dependence on the sensed current. In this way, a predetermined current profile, or a total current flow, can be delivered for particular changes in actuation level of the actuator.

In one example, the current is sensed and the applied voltage is adjusted via the control loop. Thus, there is no current source as such, but the current is controlled by controlling the voltage.

An alternative is to provide a transistor in series with the current sense resistor so that the current through the EAP actuator can be controlled by the transistor. In this case, the voltage source can have a constant voltage amplitude during the current control period, which needs to be high enough to deliver the required current. The voltage source provides a voltage high enough to deliver the required current (e.g. equal to the maximum voltage which can be applied to the EAP actuator without destroying it). The current through the EAP is then controlled via the serial transistor which functions as a variable resistor. This has the same function as reducing the voltage of a voltage source.

The current control may take place for all actuation events to the maximum actuation level from a lower actuation level, as explained above. Different charge injection may be desired for a transition from one level to the maximum level (e.g. the first high pulse of FIG. 3 which has a 0% to 100% transition) than for a transition from another level to the maximum level (e.g. the second high pulse of FIG. 3 which has a transition from 25% to 100%). The required charge injection may be obtained by extrapolating from the required current injection for the full (0% to 100%) actuation step which may be stored in a database.

However, the method may be extended to include current control during other intermediate actuations (including actuations which do not reach the full 100% level). This may again be based on interpolating between intermediate actuation levels.

If the change in actuation level is very small such a precise control may be not required.

At the limit, a continuous measurement of charge flow may take place so that the full control of the actuator is based on current control as well as voltage control.

It is possible to accelerate the mechanical deflection by using a voltage overshoot. This approach may also be used. For example, the EAP actuator may be operated for a short moment in time with a higher voltage, during which the current is measured in real time. The voltage amplitude would then be reduced or the voltage drop over a serial current limiting element may be changed once the required charge has been delivered.

When setting the required current flow profile for a given transition (e.g. 0% to 100%), the required current flow is pre-set for example provided in a datasheet. A learning system may be used to refine the system performance. As mentioned earlier, a change in charge can be observed during the transition phase, whereas in the steady state operation there is no additional offset generated, because the curves are parallel. Thus it is only necessary to ensure the total charge flow reaches the desired value during a short time, which is not much longer than the transition itself, until the charge derivatives are constant or near constant. Thus, the current control feedback loop may only need to operate with a low duty cycle, at the transition times, and normal voltage control may be used at other times.

There various ways to implement a control strategy.

A first example makes use of a current source as part of the controller 62 (in FIG. 6). The current source is used to guarantee that the same desired actuation level is always achieved by ensuring the same charge is impressed into the device. As a function of time, the charging current/charge entering the voltage-driven EAP actuator, as well as the released discharge current/charge are monitored over time.

The EAP can be actuated by a high operation voltage as long as the required charge has been impressed into the device. The initial actuation voltage during the actuation (i.e. when changing the actuator setting) may be slightly higher than typically used for the required actuation level. However, when the required charge level has been reached, the voltage can be reduced back to the normal operation voltage associated with the addressed actuation level.

In the main example outlined above, there is direct control of a current flow as well as voltage control.

In a second example, the actuator is driven to the standard voltage associated with the desired actuator setting. The current is then monitored and a small voltage compensation may then be applied based upon the monitored current. This is used to fine tune the mechanical actuation. This would require a small look-up table to map between the required current and the additional compensation voltage needed, but only a few entries would be needed as the correction is also small.

In a third example, EAP actuator is again operated by the required operation voltage, while the current is monitored. If the controller recognizes a difference in charge at identical actuation set-points, the driving voltage is further increased (or decreased) until the same charge is impressed into the EAP actuator. In this case the charge stored during the preceding actuation level needs to be recorded and stored by the controller.

The second example above for example makes use of a look-up table for fine tuning and the third example makes use of historical data to compensate additionally for example for aging effects. The system may implement learning so that the charge required to reach equal set points is stored and over time averaged. This enables improved reproducibility over time.

In a fourth example (which may be combined with any of the other examples above) a limited current is imposed when driving the actuator.

Figure 9:
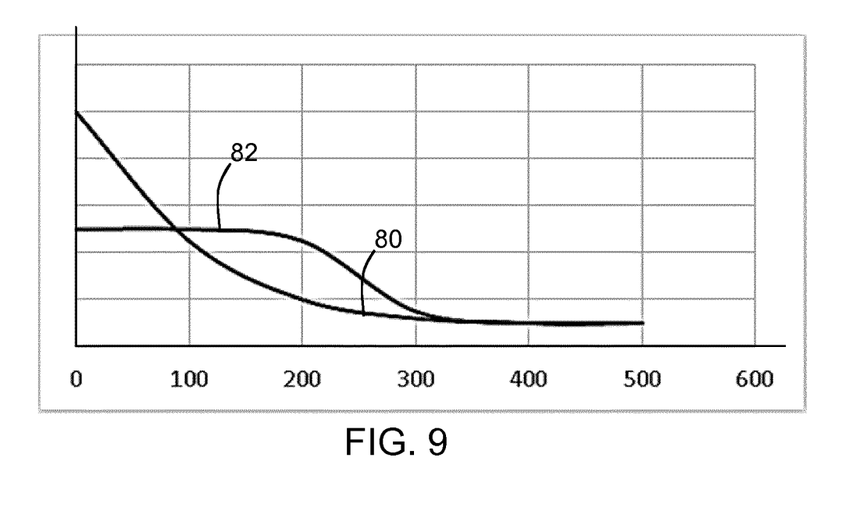
FIG. 9 shows how current limited charging of the actuator may be implemented.

FIG. 9 shows current-limited charging of an EAP. Plot 80 shows a standard charging curve and plot 82 shows a current limited charging current. For this purpose, a circuit with a current limiter is installed in the controller 62, which ensures that the charging current does not exceed a certain value. This has the added advantage that the current control is more accurate, since the initial current peak is avoided (during the initial current peak, the monitoring of the current must be in high resolution to avoid inaccuracies in charge and displacement). This has the advantage of limiting excess current on the EAP actuator which can improve the lifetime of the EAP material. When the rate limitation is chosen well, the delay in actuation is limited and acceptable (depending on the application).

In a fifth example (which may be combined with any of the other examples above) some compensation for ageing of the EAP is provided. One of the unpredictable elements of the EAP can be the values of the resistors in the equivalent circuit. Most notably, the resistance value tends to change due to degradation of the EAP material over time.

If the resistance value changes, the total current that is needed to induce a certain charge on the EAP also changes. Based on the above method the resistance values may be determined, based on analysis of the current profiles and the known voltages.

The system can then predict on the basis of changes in resistor value(s) over time what the optimal injected current on the EAP should be in order to obtain the required charge on the EAP and associated displacement.

The most simple implementation of the invention may use a 2-level voltage supply (on or off), with current source control to provide the fine tuning at the transitions from off to on. However, multi-level control is preferred in which case more complex actuation profiles (as shown above) may be formed.

The actuation waveforms may be determined in advance, for example for a cyclic operation, in which case the transitions which will take place are known and data for the current feedback control can be obtained during a calibration or from a database provided at manufacture. Alternatively, the drive level may dynamically controlled, either based on feedback control using sensing or user input. The current control loop may then operate dynamically in response to particular transitions in the actuator drive level arising.

Figure 10:
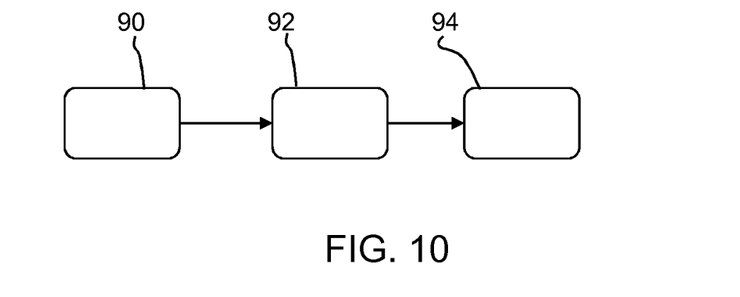
FIG. 10 shows a method of driving a field-driven electroactive polymer actuator.

FIG. 10 shows a method of driving a field-driven electroactive polymer actuator, comprising:

in step 90, applying a voltage to the actuator to change an actuation state of the actuator;

in step 92, sensing a current flowing to the actuator; and in step 94, controlling the actuation of the actuator in dependence on the sensed current, thereby to provide a predetermined current delivery for a particular change in actuation level of the actuator.

Materials suitable for the field-driven EAP layer are known.

Electro-active polymers include, but are not limited to, the sub-classes: piezoelectric polymers, electromechanical polymers, relaxor ferroelectric polymers, electrostrictive polymers, dielectric elastomers, liquid crystal elastomers.

The sub-class electrostrictive polymers includes, but is not limited to:

Polyvinylidene fluoride (PVDF), Polyvinylidene fluoride-trifluoroethylene (PVDF-TrFE), Polyvinylidene fluoride-trifluoroethylene-chlorofluoroethylene (PVDF-TrFE-CFE), Polyvinylidene fluoride-trifluoroethylene-chlorotrifluoro-ethylene) (PVDF-TrFE-CTFE), Polyvinylidene fluoride-hexafluoropropylene (PVDF-HFP), polyurethanes or blends thereof.

The sub-class dielectric elastomers includes, but is not limited to:

acrylates, polyurethanes, silicones.

If the plated electrodes are arranged in a non-symmetric configuration, the imposed voltage can induce all kinds of deformations such as twisting, rolling, torsioning, turning, and non-symmetric bending deformation.

In all of these examples, additional passive layers may be provided for influencing the electrical and/or mechanical behavior of the EAP layer in response to an applied electric field.

The EAP layer of each unit may be sandwiched between electrodes. The electrodes may be stretchable so that they follow the deformation of the EAP material layer. Materials suitable for the electrodes are also known, and may for example be selected from the group consisting of thin metal films, such as gold, copper, or aluminum or organic conductors such as carbon black, carbon nanotubes, graphene, poly-aniline (PANI), poly(3,4-ethylenedioxythiophene) (PEDOT), e.g. poly(3,4-ethylenedioxythiophene) poly(styrenesulfonate) (PEDOT:PSS). Metalized polyester films may also be used, such as metalized polyethylene terephthalate (PET), for example using an aluminum coating.

The invention can be applied in many EAP and photoactive polymer applications, including examples where a passive matrix array of actuators is of interest.

In many applications the main function of the product relies on the (local) manipulation of human tissue, or the actuation of tissue contacting interfaces. In such applications EAP actuators for example provide unique benefits mainly because of the small form factor, the flexibility and the high energy density. Hence EAP's and photoresponsive polymers can be easily integrated in soft, 3D-shaped and/or miniature products and interfaces. Examples of such applications are:

Skin cosmetic treatments such as skin actuation devices in the form of a responsive polymer based skin patches which apply a constant or cyclic stretch to the skin in order to tension the skin or to reduce wrinkles;

Respiratory devices with a patient interface mask which has a responsive polymer based active cushion or seal, to provide an alternating normal pressure to the skin which reduces or prevents facial red marks;

Electric shavers with an adaptive shaving head. The height of the skin contacting surfaces can be adjusted using responsive polymer actuators in order to influence the balance between closeness and irritation;

Oral cleaning devices such as an air floss with a dynamic nozzle actuator to improve the reach of the spray, especially in the spaces between the teeth. Alternatively, toothbrushes may be provided with activated tufts;

Consumer electronics devices or touch panels which provide local haptic feedback via an array of responsive polymer transducers which is integrated in or near the user interface;

Catheters with a steerable tip to enable easy navigation in tortuous blood vessels;

Measurements of physiological human body parameters such as heart beat, SpO2 and blood pressure.

Another category of relevant application which benefits from such actuators relates to the modification of light. Optical elements such as lenses, reflective surfaces, gratings etc. can be made adaptive by shape or position adaptation using these actuators. Here one benefit of EAPs for example is a lower power consumption.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A device for converting an electrical input into a mechanical output, comprising:
   a field-driven electroactive polymer actuator;
   a current sensor, wherein the current sensor is arranged to sense a current flowing to the electroactive polymer actuator; and a control circuit,
- wherein the control circuit is arranged to drive the electroactive polymer actuator,
- wherein the control circuit comprises a controllable voltage source,
- wherein the control circuit is arranged to control the driving of the electroactive polymer actuator in dependence on the sensed current, thereby to provide a predetermined charge delivery to the electroactive polymer actuator based on current monitoring to implement particular changes in an actuation level, and then to maintain the actuation level using voltage control, and
- wherein a period of controlling the driving is less than a period of maintaining the actuation level using the voltage control.

2. The device as claimed in claim 1, wherein the particular changes comprise actuation to at least one specific actuation level.

3. The device as claimed in claim 1, wherein the voltage source is arranged to deliver a maximum voltage of at least 50V.

4. The device as claimed in claim 1, wherein the predetermined charge delivery is provided with an actuation voltage which exceeds a voltage level used during the voltage control.

5. The device as claimed in claim 1, wherein the predetermined charge delivery is provided by a current source of the control circuit.

6. The device as claimed in claim 1, wherein the predetermined charge delivery is provided by adjusting a voltage level of the voltage source of the control circuit.

7. The device as claimed in claim 1, further comprising a current limiting circuit, wherein the current limiting circuit is arranged to limit a charging current provided to the electroactive polymer actuator.

8. The device as claimed in claim 1, wherein the control circuit is arranged to monitor a resistance value of the electroactive polymer actuator and adapt the predetermined current delivery in response to the monitored resistance value.

9. The device as claimed in claim 1, wherein the voltage source is arranged to deliver a maximum voltage of at least 100V.

10. The device as claimed in claim 1, wherein the voltage source is arranged to deliver a maximum voltage of at least 200V.

11. The device as claimed in claim 1, wherein the actuation level is maintained using the voltage control when the sensed current drops below a threshold value.

12. The device as claimed in claim 1, wherein a predetermined current profile is provided to implement the particular changes in the actuation level.

13. A method of driving a field-driven electroactive polymer actuator, comprising:
- applying a voltage to the electroactive polymer actuator so as to change an actuation state of the electroactive polymer actuator;
- sensing a current flowing to the electroactive polymer actuator; and
- controlling an actuation of the electroactive polymer actuator in dependence on the sensed current, thereby to provide a predetermined charge delivery for a particular change in an actuation level of the electroactive polymer actuator and then maintaining the actuation level using voltage control,
- wherein a period of controlling the actuation is less than a period of maintaining the actuation level using the voltage control.

14. The method as claimed in claim 13, comprising applying a maximum voltage of at least 50V.

15. The method as claimed in claim 13, comprising providing the predetermined charge delivery using a current source.

16. The method as claimed in claim 13, further comprising limiting a charging current provided to the electroactive polymer actuator.

17. The method as claimed in claim 13, comprising monitoring a resistance value of the electroactive polymer actuator and adapting the predetermined current delivery in response to the monitored resistance value.

18. The method as claimed in claim 13, comprising applying a maximum voltage of at least 100V.

19. The method as claimed in claim 13, comprising applying a maximum voltage of at least 200V.

20. The method as claimed in claim 13, comprising providing the predetermined charge delivery by adjusting a voltage level of a voltage source.

* * * * *